(12) United States Patent
Prather et al.

(10) Patent No.: US 6,496,054 B1
(45) Date of Patent: Dec. 17, 2002

(54) CONTROL SIGNAL GENERATOR FOR AN OVERVOLTAGE-TOLERANT INTERFACE CIRCUIT ON A LOW VOLTAGE PROCESS

(75) Inventors: Stephen Myles Prather, Austin, TX (US); Jeffrey William Waldrip, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/852,185

(22) Filed: May 9, 2001

Related U.S. Application Data
(60) Provisional application No. 60/204,180, filed on May 15, 2000, and provisional application No. 60/204,423, filed on May 13, 2000.

(51) Int. Cl.[7] .................................................. H03K 3/01
(52) U.S. Cl. ........................................................ 327/534
(58) Field of Search ....................... 326/80, 81; 327/530, 327/534, 535, 537

(56) References Cited

U.S. PATENT DOCUMENTS

| | | | |
|---|---|---|---|
| 4,472,647 A | 9/1984 | Allgood et al. | 307/475 |
| 4,555,642 A | 11/1985 | Morales | 307/475 |
| 4,642,488 A | 2/1987 | Parker | 307/475 |
| 4,698,526 A | 10/1987 | Allan | 307/475 |
| 4,763,021 A | 8/1988 | Stickel | 307/475 |
| 4,825,415 A | 4/1989 | Nakaizumi | 365/189 |
| 4,930,112 A | 5/1990 | Tanaka et al. | 365/226 |
| 4,937,700 A | 6/1990 | Iwahashi | 361/91 |
| 4,964,084 A | 10/1990 | Jung et al. | 365/226 |
| 5,115,150 A | 5/1992 | Ludwig | 307/475 |
| 5,117,177 A | 5/1992 | Eaton, Jr. | 323/314 |
| 5,144,167 A | 9/1992 | McClintock | 307/475 |
| 5,247,212 A | 9/1993 | Vinal | 307/448 |
| 5,268,599 A | 12/1993 | Matsui | 307/475 |
| 5,300,832 A | 4/1994 | Rogers | 307/475 |
| 5,329,184 A | 7/1994 | Redfern | 307/475 |
| 5,359,240 A | 10/1994 | Sandhu | 307/451 |
| 5,359,243 A | 10/1994 | Norman | 307/475 |
| 5,381,061 A | 1/1995 | Davis | 326/57 |
| 5,406,139 A | 4/1995 | Sharpe-Geisler | 326/71 |
| 5,451,889 A * | 9/1995 | Heim et al. | 326/81 |
| 5,455,527 A | 10/1995 | Murphy et al. | 326/83 |
| 5,455,532 A | 10/1995 | Bass | 327/306 |
| 5,467,031 A | 11/1995 | Nguyen et al. | 326/81 |
| 5,510,738 A | 4/1996 | Gorecki et al. | 327/103 |
| 5,546,020 A * | 8/1996 | Lee et al. | 326/83 |
| 5,555,149 A | 9/1996 | Wert et al. | 361/18 |
| 5,570,043 A | 10/1996 | Churchill | 326/81 |
| 5,574,678 A | 11/1996 | Gorecki | 364/807 |
| 5,576,635 A | 11/1996 | Partovi et al. | 326/27 |
| 5,635,860 A | 6/1997 | Westerwick | 326/81 |
| 5,767,733 A * | 6/1998 | Grugett | 327/436 |
| 5,844,425 A | 12/1998 | Nguyen et al. | 326/58 |
| 5,880,602 A * | 3/1999 | Kaminaga et al. | 326/58 |
| 5,914,844 A | 6/1999 | Lutley et al. | 361/111 |
| 6,049,242 A | 4/2000 | Lutley et al. | 327/333 |
| 6,320,415 B1 * | 11/2001 | Lee | 326/57 |
| 6,353,333 B1 * | 3/2002 | Curd et al. | 326/57 |

* cited by examiner

*Primary Examiner*—Jeffrey Zweizig
(74) *Attorney, Agent, or Firm*—Christopher P. Maiorana, P.C.; John J. Ignatowski

(57) ABSTRACT

A circuit that may be configured to provide a first well bias voltage to the output buffer when the output buffer is in a first mode and to provide a second well bias voltage to the output buffer when the output buffer is in a second mode. The first well bias voltage and the second well bias voltage may be used to maintain a reverse bias in diffusion wells used for electrical isolation of transistors.

19 Claims, 4 Drawing Sheets

US 6,496,054 B1

CONTROL SIGNAL GENERATOR FOR AN OVERVOLTAGE-TOLERANT INTERFACE CIRCUIT ON A LOW VOLTAGE PROCESS

This application claims the benefit of U.S. Provisional Application No. 60/204,180, filed May 15, 2000 and U.S. Provisional Application No. 60/204,423, filed May 13, 2000, which are hereby incorporated by reference in their entirety.

FIELD OF THE INVENTION

The present invention relates to a method and/or architecture for a high voltage tolerant circuit fabricated with a low voltage process generally and, more particularly, to an n-well bias control within the circuit that may not require high voltage transistors.

BACKGROUND OF THE INVENTION

The use of low voltage technologies (i.e., 3.3 volts) for CMOS transistor circuits create problems in TTL environments. Some transistors of a low voltage circuit must provide an interface to an output of a TTL capable circuit. The TTL capable circuits may drive the interface to overvoltage (i.e., as high as 5.5 volts) conditions. Consequently, the low voltage technologies must include fabrication steps that result in some or all of the transistors being tolerant of the TTL voltage levels. Such fabrication steps add to the complexity and cost of parts fabricated by using the low voltage technologies.

Another problem created by mixing 3.3 volt MOS transistors with 5 volt TTL signals is in the basic operation of p-channel type field effect transistors (PFET). A diode formed between a p-type drain diffusion in an n-type well of the PFET must remain reverse biased for proper operation. When the interface drives a PFET drain to 5 volts, and the n-well is biased to only 3.3 volts, then the drain-to-well diode becomes forward biased. The forward biased diode creates a leakage path from the interface to a power source for the low voltage circuit.

SUMMARY OF THE INVENTION

The present invention concerns a circuit that may be configured to provide a first well bias voltage to the output buffer when the output buffer is in a first mode and to provide a second well bias voltage to the output buffer when the output buffer is in a second mode. The first well bias voltage and the second well bias voltage may be used to maintain a reverse bias in diffusion wells used for electrical isolation of transistors.

The objects, features and advantages of the present invention include providing a well bias voltage control circuit within a high voltage tolerant interface circuit that may (i) maintain low voltages across transistor thin gate oxides, (ii) present signals at the interface at reasonable drive strength levels, and/or (iii) minimize leakage currents between the interface and a supply voltage source.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
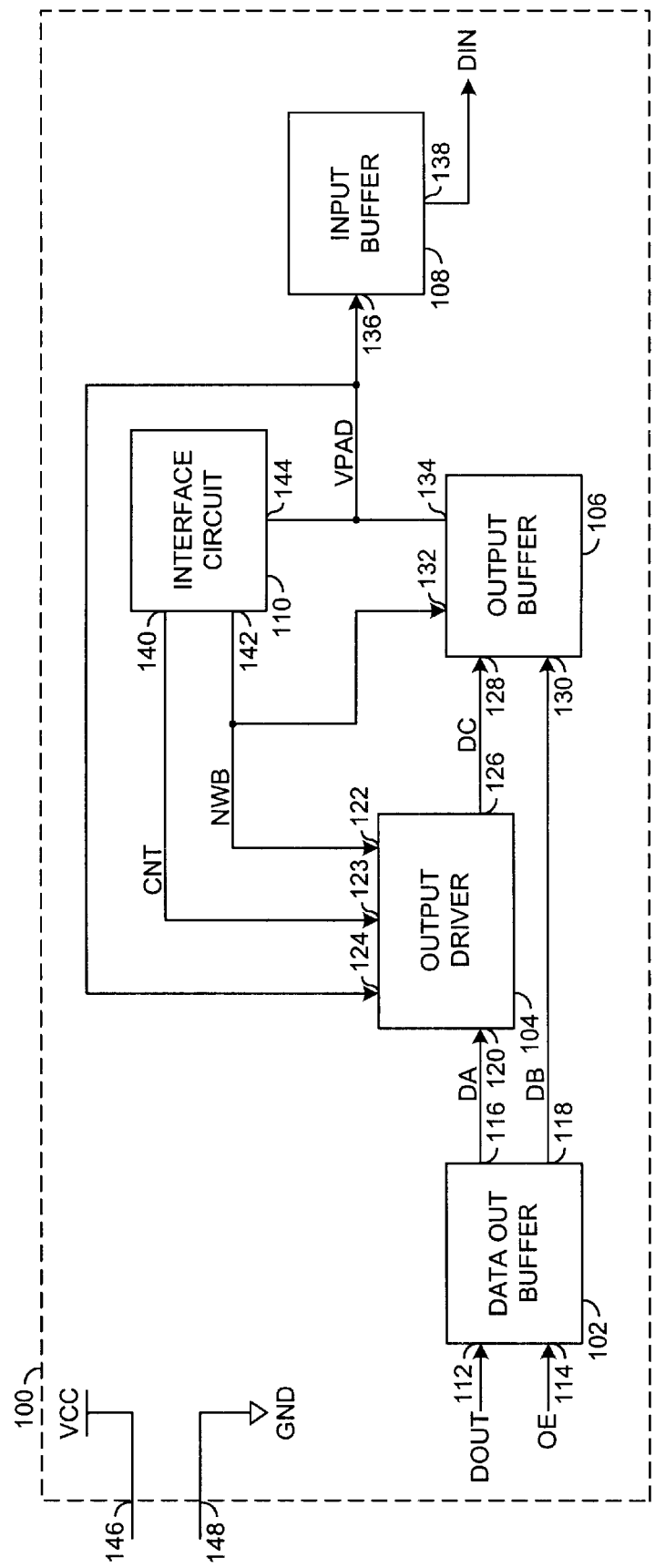
FIG. 1 is a block diagram of a circuit implementing the present invention.

Referring to FIG. 1, a block diagram of a circuit 100 is shown in accordance with a preferred embodiment of the present invention. The circuit 100 generally comprises a buffer 102, an output driver 104, an output buffer 106, an input buffer 108, and an interface circuit 110. The buffer 102 may be implemented as a data output buffer.

The data out buffer 102 may have an input 112 that may receive a signal (e.g., DOUT). The data out buffer 102 may have another input 114 that may receive another signal (e.g., OE). The data out buffer 102 may have an output 116 that may present a signal (e.g., DA). The data out buffer 102 may have another output 118 that may present another signal (e.g., DB).

The output driver 104 may have an input 120 that may receive the signal DA from the data out buffer 102. The output driver 104 may have another input 122 that may receive a signal (e.g., NWB) from the interface circuit 110. The output driver 104 may have an input 123 that may receive a signal (e.g., CNT) from the interface circuit 110. The output driver 104 may have an input 124 that may receive a signal (e.g., VPAD). The output driver 104 may have an output 126 that may present a signal (e.g., DC).

The output buffer 106 may have an input 128 that may receive the signal DC from the output driver 104. The output buffer 106 may have another input 130 that may receive the signal DB from the data out buffer 102. The output buffer 106 may have an input 132 that may receive the signal NWB from the interface circuit 110. The output buffer 106 may have an output 134 that may present the signal VPAD.

The input buffer 108 may have an input 136 that may receive the signal VPAD. The input buffer 108 may have an output 138 that may present a signal (e.g., DIN). The signal DIN may be presented internally and/or externally to the circuit 100.

The interface circuit 110 may have an output 140 that may present the signal CNT to the output driver 104. The interface circuit 110 may have another output 142 that may present the signal NWB. The interface circuit 110 may have a bidirectional interface 144 that may present and receive the signal VPAD.

The circuit 100 may have an input 146 that may receive a supply voltage (e.g., VCC). The circuit 100 may have another input 148 that may receive a ground voltage (e.g., GND). The ground voltage GND may also be implemented as a floating ground (e.g., VSS) or other ground-like voltage to meet the design criteria of a particular implementation. The supply voltage VCC may provide low voltage electrical power to the circuit 100. In one example, the supply voltage VCC may be 3.3 volts with respect to ground voltage GND. However, other supply voltages VCC may be used to meet the design criterial of a particular application.

The signal DOUT may be a data-output signal. The signal DOUT may range from a logical HIGH value (e.g., 3.3 volts) and a logical LOW value (e.g., zero volts or ground) at different times. The signal OE may serve as an output enable signal. While the signal OE is in an enable state, the data out buffer 102 may present the signals DA and DB equal to the signal DOUT. While equal to the signal DOUT, the signals DA and DB may convey information destined for the output buffer 106. While the signal OE is in a disable state, the data out buffer 102 may present the signal DA in the logical HIGH state and the signal DB in the logical LOW state. While in opposite states, the signals DA and DB may ultimately serve to tri-state the output buffer 106.

The output driver 104 may present the signal DC to be the same as the signal DA while the signal VPAD is below an overvoltage threshold voltage. The output driver 104 may present the signal DC in the logical HIGH state and the logical LOW state at different times, responsive to the signal DA. The output driver 104 may present the signal DC in an overvoltage state (e.g., >3.3 volts) while the signal VPAD is greater than or equal to the overvoltage threshold voltage. While the signal VPAD is greater than or equal to the overvoltage threshold voltage, the signal DC may generally track the signal VPAD in voltage amplitude and polarity (e.g., DC=VPAD).

The signal NWB may be an n-well bias voltage. The signal NWB generally has a voltage ranging in amplitude from the supply voltage VCC to the signal VPAD. The signal NWB may be used to bias all n-type wells in the circuit 100 or just selected n-type wells for transistors in the output driver 104, the output buffer 106, and the interface circuit 110.

The signal CNT may be a control signal. The signal CNT may be in the logical LOW state while the signal VPAD is less than the overvoltage threshold voltage. The signal CNT may be in the overvoltage state while the signal VPAD is greater than or equal to the overvoltage threshold voltage. The signal CNT generally tracks the voltage amplitude and polarity of the signal VPAD (e.g., CNT=VPAD) while the signal CNT is in the overvoltage state.

The signal VPAD may convey input data and output data. The signal VPAD is generally a voltage on an interface pad of the circuit 100. As output data, the signal VPAD may vary between the logical LOW state and the logical HIGH state at different times. As input data, the signal VPAD may vary between the logical LOW state and the logical HIGH state at different times when driven by another low voltage circuit operating from the supply voltage VCC. The signal VPAD may also vary between the logical LOW state and the overvoltage state (e.g., a TTL logical HIGH state) at different times when driven by a TTL compatible circuit.

The signal DIN may be a buffered input signal. The signal DIN may vary between the logical LOW state and the logical HIGH state at different times. The signal DIN generally tracks the signal VPAD in voltage amplitude. However, the signal DIN may be limited in voltage amplitude to the supply voltage VCC. In one example, the input buffer 108 may present the signal DIN with the same logical polarity as the signal VPAD (e.g., the input buffer 108 may be non-inverting). Alternatively, the input buffer 108 may present the signal DIN with an opposite logical polarity as the signal VPAD (e.g., the input buffer 108 may be inverting) to meet the design criterial of a particular implementation.

In one example, the transistors of the circuit 100 may be fabricated with a 0.3 micron technology. The 0.3 micron technology may allow for a maximum voltage across a thin gate oxide of 3.6 volts. Since the signals VPAD, CNT and NWB may have voltages greater than 3.6 volts, the design of the circuit 100 is generally arranged so that gate-to-source voltages, gate-to-drain voltages, and gate-to-channel substrate voltages may experience a maximum voltage no greater than the supply voltage VCC (e.g., 3.3 volts).

Figure 2:
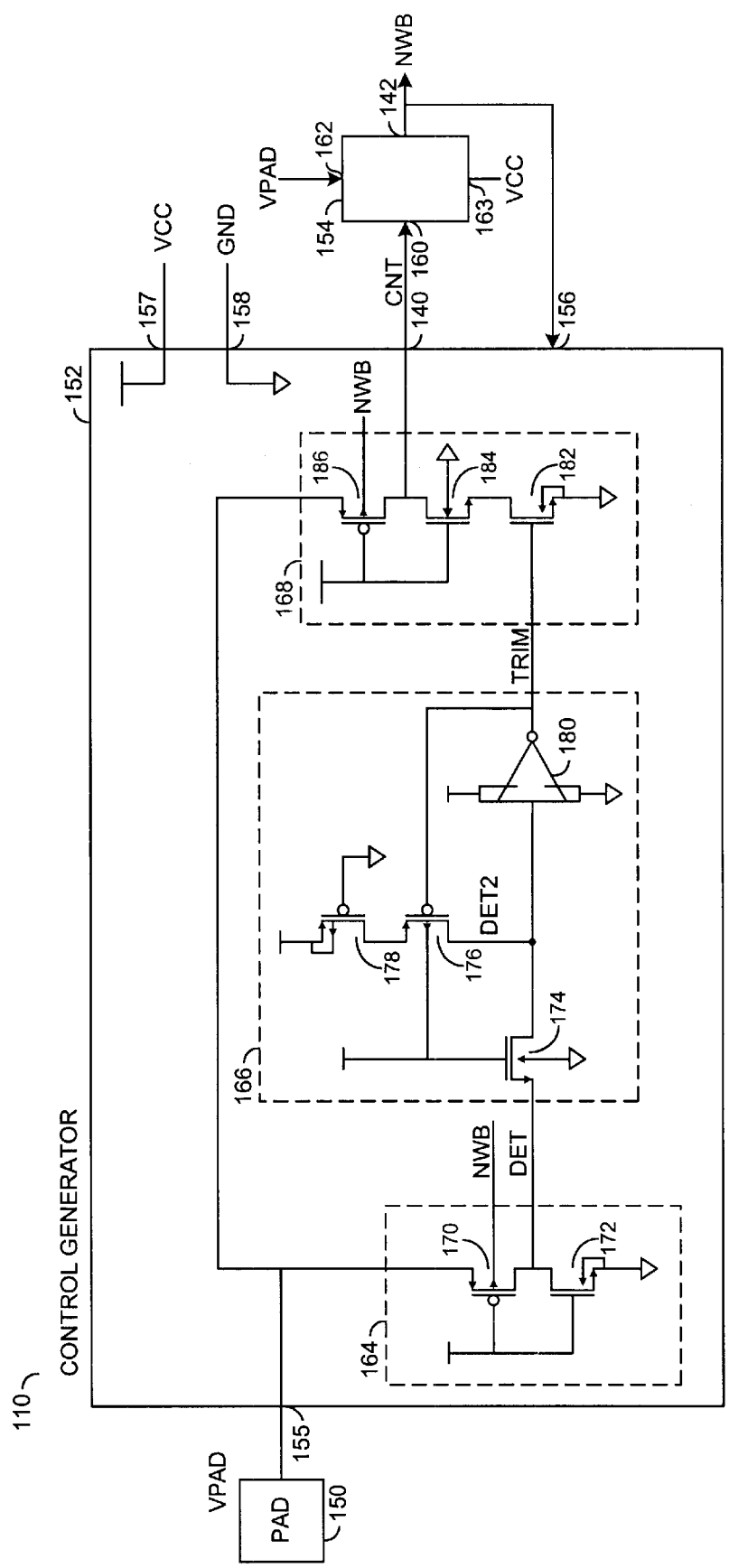
FIG. 2 is a block diagram of an interface circuit within the circuit.

Referring to FIG. 2, a schematic of the interface circuit 110 is shown. The interface circuit 110 generally comprises a pad 150, a circuit 152, and a circuit 154. The pad 150 may provide an interface to other circuits or busses internal and/or external to the circuit 100. The circuit 152 may be implemented as a control generator. The circuit 154 may be implemented as a multiplexer or a switching circuit.

The control generator 152 may have an input 155 that may receive the signal VPAD. The control generator 152 may have an input 156 that may receive the signal NWB. The control generator 152 may have an input 157 that may receive the supply voltage VCC. The control generator 152 may have an input 158 that may receive the ground voltage GND. The control generator 152 may have the output 140 that may provide the signal CNT.

The switch circuit 154 may have an input 160 that may receive the signal CNT from the control generator 152. The switch circuit 154 may have an input 162 that may receive the signal VPAD from the pad 150. The switch circuit 154 may have an input 163 that may receive the supply voltage VCC. The switch circuit 154 may have the output 142 that may present the signal NWB.

The control generator 152 generally comprises a circuit 164, a circuit 166, and a circuit 168. The circuit 164 may be implemented as a high voltage detection circuit. The circuit 166 may be implemented as a trim circuit. The circuit 168 may be implemented as an inverter circuit.

The high voltage detection circuit 164 may receive the signal VPAD from the pad 150. The high voltage detection circuit 164 may receive the signal NWB from the switch circuit 154. The high voltage detection circuit 164 may also receive the supply voltage VCC and the ground voltage GND. The high voltage detection circuit 164 may present a signal (e.g., DET) to the trim circuit 166.

The trim circuit 166 may receive the signal DET from the high voltage detection circuit 164. The trim circuit 166 may also receive the supply voltage VCC and the ground voltage GND. The trim circuit 166 may present a signal (e.g., TRIM) to the inverter circuit 168.

The inverter circuit 168 may receive the signal TRIM from the trim circuit 166. The inverter circuit 168 may receive the supply voltage VCC and the ground voltage GND. The inverter circuit 168 may present the signal CNT.

The signal DET may be a high voltage detection signal or a high voltage trip signal. The signal DET may range in voltage from the logical LOW state through the overvoltage state. The signal DET may be in the logical LOW state when the signal VPAD is less than the overvoltage threshold. The signal DET may be in the overvoltage state while the signal VPAD is greater than or equal to the overvoltage threshold.

The signal TRIM may be another high voltage detection signal or another high voltage trip signal. The signal TRIM may range from the logical LOW state to the logical HIGH state. The signal TRIM may generally be the signal DET arranged to transition between states around a lower voltage.

The high voltage circuit 164 may comprise a transistor 170 and a transistor 172. The transistor 170 may be implemented as a p-type enhancement mode field effect transistor (PFET). The transistor 172 may be implemented as an n-type enhancement node field effect transistor (NFET). However, other types of transistors may be implemented in accordance with the design criteria of a particular implementation. For example, NPN bipolar transistors, PNP biploar transistors, junction field effect transistors, metal-semiconductor field effect transistors, metal-oxide-semiconductor field effect transistors, depletion mode field effect transistors, and the like may be implemented.

The transistor 170 may have a source node coupled to the pad 150 that may receive the signal VPAD. The transistor 170 may have a gate node biased by the supply voltage VCC. The transistor 170 may have a drain node coupled to a drain node of the transistor 172. The transistor 170 may have an n-type well that may receive the signal NWB from the switch circuit 154.

The transistor 172 may have the drain node coupled to the drain node of the transistor 170. The transistor 172 may have a gate node biased by the supply voltage VCC. The transistor 172 may have a source node biased by the ground voltage GND. The transistor 172 may have a p-type channel substrate biased by the ground voltage GND.

The signal DET may be presented from the node connecting the drain node of the transistor 170 to the drain node of the transistor 172. In general, the transistor 172 may be configured to always conduct or "on". Consequently, the transistor 172 may bias or pull the signal DET toward the logical LOW state.

Since the gate node of the transistor 170 may be biased by the supply voltage VCC, the transistor 170 may be normally configured to be non-conducting or "off" while the signal VPAD is less than the overvoltage threshold voltage. As the signal VPAD increases in voltage above the supply voltage VCC, the source node of the transistor 170 may become more positive than the gate node. When the signal VPAD reaches the supply voltage VCC plus a PFET gate-to-source threshold voltage (e.g., VTP), then the transistor 170 may begin to conduct or switch "on". The voltage VCC+VTP may be referred to as the overvoltage threshold. By designing the transistor 170 to have a strong conductance and the transistor 172 to have a weak conductance, the transistor 170 may pull the signal DET toward the logical HIGH state. As the signal VPAD increases in voltage, conductance of the transistor 170 may generally increase causing the signal DET to increase. For sufficiently large values of the signal VPAD, the signal DET may generally track the signal VPAD (e.g., DET=VPAD). Consequently, the signal DET may range in voltage from zero volts to 5.5 volts, or greater. The signal DET may be in the overvoltage state while greater than the supply voltage VCC.

The trim circuit 166 generally comprises a transistor 174, a transistor 176, a transistor 178, and an inverter 180. The transistor 174 may be implemented as an NFET. The transistor 176 may be implemented as a PFET. The transistor 178 may be implemented as a PFET. However, other types of transistors may be implemented to meet the design criteria of a particular application.

The transistor 174 may have a drain node coupled to the drain node of the transistor 172 that may receive the signal DET. The transistor 174 may have a source node coupled to an input of the inverter 180. The transistor 174 may have a gate node biased by the supply voltage VCC. The transistor 174 may have a channel substrate couple to the ground voltage GND.

The transistor 176 may have a source node coupled to a drain node of the transistor 178. The transistor 176 may have a gate node coupled to an output of the inverter 180 that may receive the signal TRIM. The transistor 176 may have a drain node coupled to the input of the inverter 180. The transistor 176 may have a channel substrate biased by the supply voltage VCC.

The transistor 178 may have a source node biased by the supply voltage VCC. The transistor 178 may have a gate node biased by the ground voltage GND. The transistor 178 may have the drain node coupled to the source node of the transistor 176. The transistor 178 may have an n-type well biased by the supply voltage VCC.

The inverter 180 may have the input coupled to the source node of the transistor 174 and the drain node of the transistor 176. The inverter 180 may have the output node coupled to the gate node of the transistor 176 and to the inverter circuit 168. The inverter 180 may present the signal TRIM. The inverter 180 may receive the supply voltage VCC and the ground voltage GND.

The signal DET received at the drain node may be presented as another signal (e.g., DET2) at the source node of the transistor 174. The transistor 174 may limit an upper voltage that the signal DET2 may achieve. Since the gate node of the transistor 174 may be biased by the supply voltage VCC, then the signal DET2 may only have an upper voltage of VCC-VTN, where VTN is an NFET gate-to-source threshold voltage. The signal DET2 may range from the logical LOW state to the logical HIGH state. Consequently, the transistor 174 generally isolates the rest of the trim circuit 166 from the voltages conveyed by the signal DET greater than the supply voltage VCC.

The transistor 176 may be conducting or "on" while the signal TRIM is in the logical LOW state and not conducting or "off" while the signal TRIM is in the logical HIGH state. While the transistor 176 is conducting and the signal DET is in the overvoltage state, the transistor 176 generally biases or pulls the signal DET2 toward the supply voltage VCC and the top of the logical HIGH state. Here, the signal DET2 may achieve a sufficiently high voltage to cause a PFET transistor at the input of the inverter 180 to stop conducting or switch "off". Without the transistor 176, a small direct current crowbar current may flow through the inverter 180 while the signal DET2 is at VCC-VTN volts. While the signal DET2 is in the logical LOW state, the signal TRIM may cause the transistor 176 to stop conducting. With the transistor 176 not conducting, the transistor 172 may bias or pull the signal DET2 to the bottom of the logical LOW state.

The transistor 176 and the transistor 178 may have a very weak conductance so that while the signal DET is in the logical LOW state, the transistor 172 may bias or pull the signal DET2 to the logical LOW state. To achieve the very weak conductance, a channel width to length ratio of one or both of the transistor 176 and the transistor 178 may be very small (e.g., W/L may range from 1/200 to 1/50, most preferably W/L=1/100). A large gate node capacitance may result from the large channel length. Driving the large gate node capacitance with the inverter 180 may slow a response time of the signal TRIM. To help reduce the capacitive loading of the output of the inverter 180, the transistor 176 may have a nominal channel width to length ratio (e.g., W/L may range from 10/1 to 1/10, most preferably W/L=2/1). The transistor 178 may have the large channel width to length ratio (e.g., W/L ranging from 1/200 to 1/50). Consequently, a gate node capacitance of the transistor 176 may be made reasonably small as compared to a gate node capacitance of the transistor 178.

The net effect of the trim circuit 166 may be to present the signal TRIM as a skewed version of the signal VPAD moved downward in voltage and delayed in time. The signal VPAD generally transitions between the logical LOW state and the overvoltage state around the overvoltage threshold (VCC+VTP). The signal TRIM generally transitions between the logical LOW state and the logical HIGH state around a conventional CMOS threshold (e.g., approximately midway between the supply voltage VCC and the ground voltage GND). Therefore, the signal TRIM may cross the CMOS threshold a short time after the signal VPAD crosses the overvoltage threshold.

The inverter circuit 168 generally comprises a transistor 182, a transistor 184, and a transistor 186. The transistor 182 may be implemented as an NFET. The transistor 184 may be implemented as an NFET. The transistor 186 may be implemented as a PFET. However, other types of transistors may be implemented to meet the design criteria of a particular application.

The transistor 182 may have a drain node coupled to a source node of the transistor 184. The transistor 182 may have a gate node coupled to the output of the inverter 180 that may receive the signal TRIM. The transistor 182 may have a source node coupled to the ground voltage GND. The transistor 182 may have a channel substrate coupled to the ground voltage GND.

The transistor 184 may have a drain node coupled to a drain node of the transistor 186. The transistor 184 may have a gate node biased by the supply voltage VCC. The transistor 184 may have the source node coupled to the drain node of the transistor 182. The transistor 184 may have a channel substrate biased by the ground voltage GND.

The transistor 186 may have a source node coupled to the signal VPAD. The transistor 186 may have a gate node biased by the supply voltage VCC. The transistor 186 may have the drain node coupled to the drain node of the transistor 184. The transistor 186 may have a n-type well biased by the signal NWB.

The transistor 186 generally has a gate-to-source threshold voltage that matches a gate-to-source threshold voltage of the transistor 170. Consequently, the transistors 170 and 186 may transition from non-conducting or "off" to conducting or "on" at approximately the same time. Otherwise, the transistor 186 may transition to conducting at a different threshold than the transistor 170. The transistor 170 becoming conducting may ultimately cause the transistor 182 to become non-conducting. The transistor 184 may protect the transistor 182 from voltages conveyed by the signal CNT greater than the supply voltage VCC.

Figure 3:
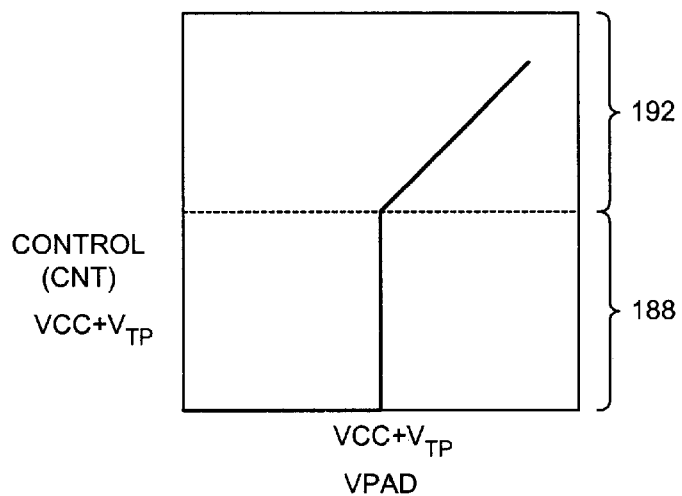
FIG. 3 is a graph of a control signal as a function of a pad voltage.

Referring to FIG. 3, a graph of the signal CNT as a function of the signal VPAD is shown. The signal CNT may be presented from the combined drain node of the transistor 186 and the drain node of the transistor 184. The signal CNT is generally in the logical LOW state (e.g., voltage range 188) while the signal VPAD is less than the overvoltage threshold (e.g., voltage 190). The signal CNT is generally in the overvoltage state (e.g., voltage range 192) while the signal VPAD is greater than or equal to the overvoltage threshold. The signal CNT may track the signal VPAD in voltage amplitude and polarity while in the overvoltage state.

Figure 4:
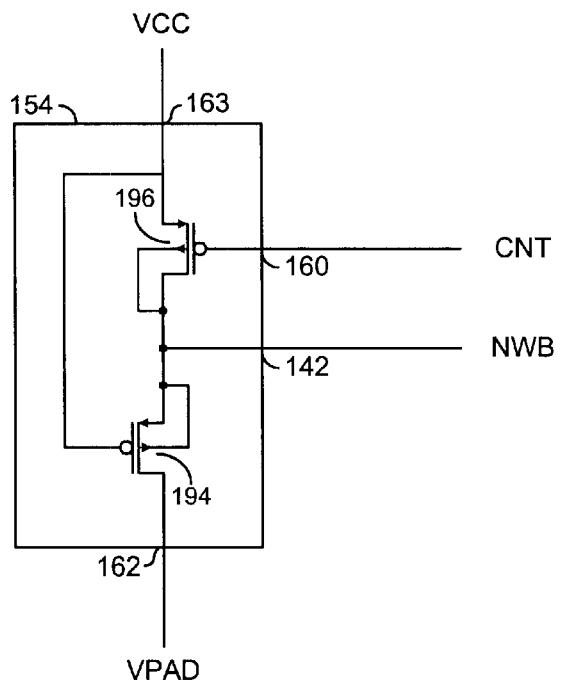
FIG. 4 is a schematic of a switch circuit.

Referring to FIG. 4, a schematic of the switch circuit 154 is shown. The switch circuit 154 generally comprises a transistor 194 and a transistor 196. The transistor 194 may be implemented as a PFET. The transistor 196 may be implemented as a PFET. However, other types of transistors may be implemented to meet the design criteria of a particular application.

The transistor 194 may have a source node coupled to a drain node of the transistor 196. The transistor 194 may have a gate node biased by the supply voltage VCC. The transistor 194 may have a drain node coupled to the pad 150 that may receive the signal VPAD. The transistor 194 may have an n-type well coupled to the drain node.

The transistor 196 may have a source node biased by the supply voltage VCC. The transistor 196 may have a gate node coupled to the control generator 152 that may receive the signal CNT. The transistor 196 may have the drain node coupled to the source node of the transistor 194. The transistor 196 may have an n-type well coupled to a source node of the transistor 196.

The combination of the drain node of the transistor 196 and the source node of the transistor 194 may present the signal NWB. The signal NWB may be controlled by the signals VPAD and the signal CNT. While the signal VPAD is less than the overvoltage threshold 190 the signal CNT may be in the logical LOW state. Consequently, the transistor 194 may be non-conducting and the transistor 196 may be conducting. The signal NWB may be pulled or switched to the supply voltage VCC in response to the transistor 196 conducting and the transistor 194 non-conducting.

While the signal VPAD is greater than or equal to the overvoltage threshold 190, the signal CNT may be in the overvoltage state. Consequently, the transistor 194 may be conducting and the transistor 196 may be non-conducting. The signal NWB may be pulled or switched to the signal VPAD in response to the transistor 194 conducting and the transistor 196 non-conducting.

The signal NWB is generally fed back to the high voltage detection circuit 164, the inverter circuit 168, the output buffer 106 and the output driver 104. However, the signal NWB may be presented to other circuits and transistors within the circuit 100. The signal NWB in the overvoltage state generally prevents diodes formed by p-type drain node diffusions in n-type wells of the PFETs from becoming forward biased during overvoltage conditions. The reverse biased diodes, therefore, generally prevent the signal VPAD from coupling with the supply voltage VCC.

Figure 5:
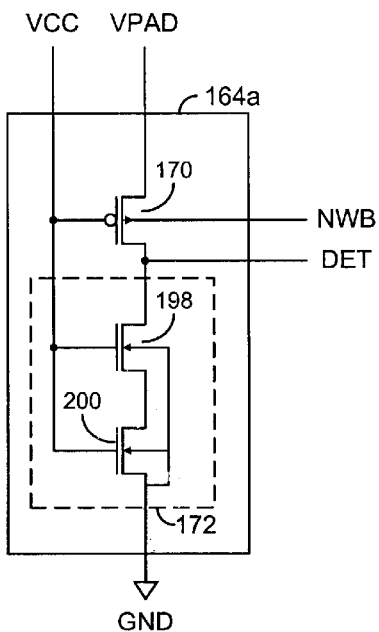
FIG. 5 is an alternative embodiment of a high voltage detection circuit.

Referring to FIG. 5, a schematic of an alternative embodiment of the high voltage detection circuit 164A is shown. The alternative high voltage detection circuit 164A may divide the transistor 172 into a transistor 198 and a transistor 200. The transistor 198 may be implemented as an NFET. The transistor 200 may be implemented as an NFET. However, other types of transistors may be implemented to meet the design criterial of a particular implementation.

The transistor 198 may have a drain node coupled to the drain node of the transistor 170. The transistor 198 may have a gate node biased by the supply voltage VCC. The transistor 198 may have a source node coupled to a drain node of the transistor 200. The transistor 198 may have a channel substrate biased by the ground voltage GND.

The transistor 200 may have the drain node coupled to the source node of the transistor 198. The transistor 200 may have a gate node biased by the supply voltage VCC. The transistor 200 may have a source node biased by the ground voltage GND. The transistor 200 may have a channel substrate biased by the ground voltage GND.

Figure 6:
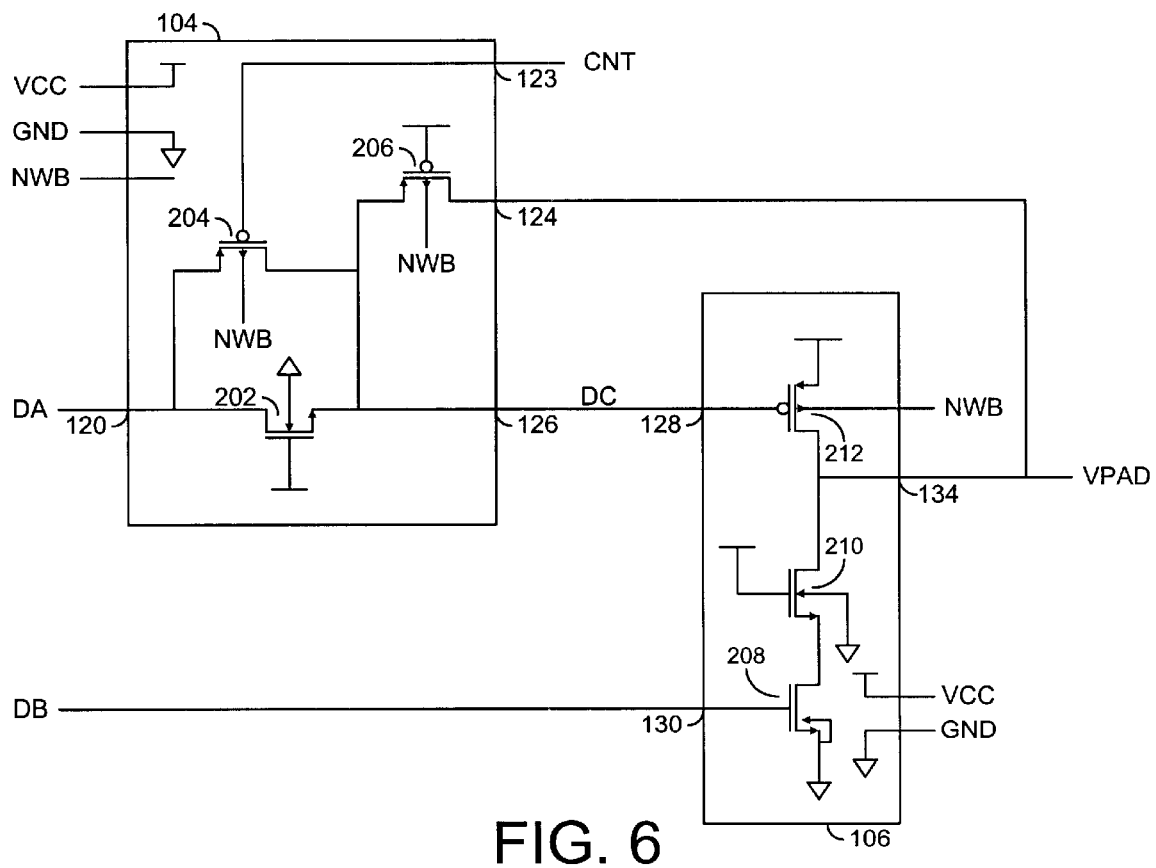
FIG. 6 is a schematic of an output driver and an output buffer.

Referring to FIG. 6, a schematic of the output driver 104 and the output buffer 106 is shown. The output driver 106 may comprise a transistor 202, a transistor 204, and a transistor 206. The transistor 202 may be implemented as an NFET. The transistor 204 and the transistor 206 may be implemented as PFETs.

The transistor 202 and the transistor 204 may be configured as a pass gate disposed between the input 120 and the output 126. The transistor 202 may have a drain node that may receive the signal DA from the data out buffer 102. The transistor 202 may have a gate node biased to the supply voltage VCC. The transistor 202 may have a source node that may present the signal DC to the output buffer 106. The transistor 202 may have a channel substrate biased to the ground voltage GND.

The transistor 204 may have a drain node that may receive the signal DA from the data out buffer 102. The transistor 204 may have a gate node that may receive the signal CNT from the interface circuit 110. The transistor 204 may have a source node that may present the signal DC to the output buffer 106. The transistor 204 may have an n-type well that may receive the signal NWB from the switch circuit 154.

The transistor 206 may have a drain node that may receive the signal VPAD from the pad 150. The transistor 206 may have a gate node biased by the supply voltage VCC. The transistor 206 may have a source node coupled to the source node of the transistor 202 and the source node of the transistor 204. The transistor 206 may have an n-type well that may receive the signal NWB from the switch circuit 154.

While the signal OE is in the enable state and the signal CNT is in the logical LOW state, the pass gate formed by the transistors 202 and 204 generally passes the signal DA at the input 120 to the output 126 as the signal DC. While the signal OE is in the disable state and the signals VPAD and CNT are in the overvoltage state, the transistor 206 may be conducting or "on". With the transistor 206 conducting, the signal VPAD may be presented from the input 124 to the output 126 as the signal DC.

The output buffer 106 generally comprises a transistor 208, a transistor 210, and a transistor 212. The transistor 208 and the transistor 210 may be implemented as NFETs. The transistor 212 may be implemented as a PFET. However, other types of transistors may be implemented to meet the design criteria of a particular implementation.

The transistor 208 may have a drain node coupled to a source node of the transistor 210. The transistor 208 may have a gate node that may receive the signal DB from the data out buffer 102. The transistor 208 may have a source node biased to the ground voltage GND. The transistor 208 may have a channel substrate biased to the ground voltage GND.

The transistor 210 may have a drain node coupled to a drain node of the transistor 212. The transistor 210 may have a gate node biased to the supply voltage VCC. The transistor 210 may have the source node coupled to the drain node of the transistor 208. The transistor 210 may have a channel substrate biased to the ground voltage GND.

The transistor 212 may have a source node biased to the supply voltage VCC. The transistor 212 may have a gate node that may receive the signal DC from the output buffer 104. The transistor 212 may have the drain node coupled to the drain node of the transistor 210. The transistor 212 may have an n-type well that may receive the signal NWB from the switch circuit 154. The combined drain node of the transistor 212 and the drain node of the transistor 210 may present the signal VPAD to the pad 150.

While the signals DB and DC are both in the logical HIGH state or the logical LOW state, the output buffer 106 may be in an active or low voltage mode. The output buffer 106 may drive the signal VPAD to the opposite logical state (e.g., VPAD=/DC) while in the active mode. While the signal DB is in the logical LOW state and the signal DC is in the logical HIGH state, the output buffer 106 may be in a tri-state mode. The transistors 208 and 212 may be non-conducting or "off" while the output buffer 106 is in the tri-state mode. The output buffer 106 thus may present a high impedance to the pad 150 while in the tri-state mode.

The signal VPAD may be presented in the overvoltage state to the output buffer 106. The output buffer 106 may be considered in an overvoltage or high voltage mode. While the output buffer 106 is in the overvoltage mode, the transistor 210 may provide a drain-to-source voltage drop that maintains the gate-to-drain voltage of the transistor 208 to less than the supply voltage VCC. The signal VPAD in the overvoltage state may also cause the transistor 206 of the output driver 104 to conduct or switch "on". When the transistor 206 conducts, the signal VPAD may be passed to the output 126 of the output driver 104 as the signal DC. In turn, the signal DC in the overvoltage state may insure that the transistor 212 may be non-conducting or "off" since the gate-to-source voltage of transistor 212 may be approximately zero volts.

While the signal DC is in the overvoltage state, a source-to-drain voltage drop across the transistor 202 may prevent the signal DA from being driven to the overvoltage state through the transistor 202. The signal CNT may also enter the overvoltage state thus causing the transistor 204 to be non-conducting or "off". The transistor 206 may be designed to have a weak conductance so that the signal DC is not driven into the overvoltage state until the signal CNT switches the transistor 204 off. As a result, the signal DA may be prevented from being driven to the overvoltage state through the transistor 204.

The PFET transistors that may have the signal VPAD applied to a non-well node (e.g., the source node or drain node) may also have the gate node biased to the supply voltage VCC, directly to the signal VPAD, or indirectly to the signal VPAD (e.g., through the signal CNT and the signal DC). Consequently, a voltage drop less than the supply voltage VCC may be maintained across the gate insulators of the PFET transistors. The NFET transistors that may have the signal VPAD applied to the source node or drain node may also have the gate node biased to the supply voltage VCC. As a result, a voltage drop less than the supply voltage VCC may be maintained across the gate insulators of the NFET transistors.

The various signals of the present invention are generally "on" (e.g., a logical or digital HIGH, or 1) or "off" (e.g., a logical or digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A circuit configured to provide a first well bias voltage to an output buffer when said output buffer is in a first mode, and to provide a second well bias voltage larger than said first well bias voltage to said output buffer when said output buffer is in a second mode, wherein all gate insulators within said circuit experience a maximum voltage drop not greater than said first well bias voltage.

2. The circuit according to claim 1, wherein (i) said second well bias voltage is larger than said first well bias voltage and (ii) said second well bias voltage is applied to a well node of each transistor within said circuit receiving a voltage at a non-well node greater than said first well bias voltage.

3. A circuit comprising:

a pad configured to present a pad signal;

a control circuit configured to present a control signal in (i) a first state in response to said pad signal being less than a first threshold and (ii) a second state in response to said pad signal being greater than said first threshold; and a switch circuit configured to present (i) a first well bias voltage to an output buffer in response to said control signal being in said first state and (ii) a second well bias voltage to said output buffer in response to said control signal being in said second state.

4. The circuit according to claim 3, wherein said second well bias voltage tracks said pad signal in voltage.

5. The circuit according to claim 3, wherein said control circuit comprises a detection circuit configured to present a detection signal in (i) said second state in response to said pad signal being greater than said first threshold and (ii) said first state in response to said pad signal being less than said first threshold.

6. The circuit according to claim 5, wherein said detection signal tracks said pad signal in voltage while said detection signal is in said second state.

7. The circuit according to claim 5, wherein said control circuit further comprises a trim circuit configured to present a trim signal in (i) a third state in response to said detection signal being less than a second threshold and (ii) said first state in response to said detection signal being greater than said second threshold.

8. The circuit according to claim 7, wherein said trim circuit comprises:

a first transistor configured to present a first signal that tracks said detection signal in voltage up to a source-to-ground voltage of said first transistor that is less than said first well bias voltage;

an inverter configured to (i) receive said first signal at an inverter input and (ii) produce said trim signal in response to said first signal; and a second transistor configured to (i) bias said inverter input toward said third state in response to said trim signal in said first state and (ii) not bias said inverter input in response to said trim signal in said second state.

9. The circuit according to claim 7, wherein said control circuit further comprises an inverter circuit configured to present said control signal in (i) said first state in response to said trim signal in said third state and (ii) said third state in response to said trim signal in said first state.

10. The circuit according to claim 9, wherein said inverter circuit comprises:

a fourth transistor configured to (i) couple said control signal to said pad signal in response to said pad signal being greater than a third threshold and (ii) not couple said control signal to said pad signal in response to said pad signal being less than said third threshold;

a fifth transistor configured to (i) bias said control signal toward said first state in response to said trim signal in said third state and (ii) not bias said control signal in response to said trim signal in said first state; and a sixth transistor disposed between said fourth transistor and said fifth transistor and configured to limit a drain-to-source voltage of said fifth transistor to less than said first well bias voltage.

11. The circuit according to claim 5, wherein said detection circuit comprises:

a first transistor configured to (i) couple said detection signal to said pad signal in response to said pad signal being greater than said first threshold and (ii) uncouple said detection signal from said pad signal in response to said pad signal being less than said first threshold;

a second transistor configured to bias said detection signal toward said first state; and a third transistor in series with said second transistor and configured to limit a drain-to-source voltage of said second transistor to less than said first well bias voltage.

12. A method for controlling a well bias voltage, comprising the steps:

(A) receiving a pad signal from a pad;

(B) presenting a control signal in a first state in response to said pad signal being less than a first threshold;

(C) presenting said control signal in a second state in response to said pad signal being greater than said first threshold;

(D) presenting a first well bias voltage to an output buffer in response to said control signal being in said first state; and (E) presenting a second well bias voltage to said output buffer in response to said control signal being in said second state.

13. The method according to claim 12, further comprising the step of tracking said second well bias voltage to said pad signal in voltage in response to presenting said second well bias voltage.

14. The method according to claim 12, further comprising the steps of:

presenting a detection signal in said second state in response to said pad signal being greater than said first threshold; and presenting said detection signal in said first state in response to said pad signal being less than said first threshold.

15. The method according to claim 14, further comprising the step of tracking said detection signal to said pad signal in voltage while said detection signal is in said second state.

16. The method according to claim 14, further comprising the steps of:

presenting a trim signal in a third state in response to said detection signal being less than a second threshold; and presenting said trim signal in said first state in, response to said detection signal being greater than said second threshold.

17. The method according to claim 12, further comprising the steps of:

presenting said control signal in said first state in response to a trim signal in a third state; and presenting said control signal in said third state in response to said trim signal in said first state.

18. The method according to claim 16, wherein the sub-steps of presenting said trim signal comprises the steps of:

tracking a first signal to said detection signal in voltage up to a voltage that is less than said first well bias voltage in response to said pad signal being greater than said first threshold;

biasing said first signal toward said third state in response to said trim signal in said first state;

not biasing said first signal in response to said trim signal in said second state; and inverting said first signal to produce said trim signal in response to presenting said first signal.

19. A circuit comprising:

means for receiving a pad signal from a pad;

means for presenting a control signal in (i) a first state in response to said pad signal being less than a first threshold and (ii) a second state in response to said pad signal being greater than said first threshold; and means for presenting (i) a first well bias voltage to an output buffer in response to said control signal being in said first state and (ii) a second well bias voltage to said output buffer in response to said control signal being in said second state.

* * * * *